US009575412B2

(12) United States Patent
Lu et al.

(10) Patent No.: US 9,575,412 B2
(45) Date of Patent: Feb. 21, 2017

(54) METHOD AND SYSTEM FOR REDUCING POLE IMBALANCE BY ADJUSTING EXPOSURE INTENSITY

(71) Applicant: Taiwan Semiconductor Manufacturing Company, Ltd., Hsin-Chu (TW)

(72) Inventors: Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 99 days.

(21) Appl. No.: 14/231,119

(22) Filed: Mar. 31, 2014

(65) Prior Publication Data
US 2015/0277234 A1    Oct. 1, 2015

(51) Int. Cl.
*G03B 27/68* (2006.01)
*G03F 7/20* (2006.01)

(52) U.S. Cl.
CPC .......... *G03F 7/70133* (2013.01); *G03F 7/701* (2013.01); *G03F 7/70141* (2013.01)

(58) Field of Classification Search
CPC .................................................. G03F 7/70133
See application file for complete search history.

(56) References Cited

U.S. PATENT DOCUMENTS

| 4,896,952 A * | 1/1990 | Rosenbluth .......... G02B 17/008 359/638 |
| 5,602,643 A * | 2/1997 | Barrett ................. G01B 11/306 356/495 |
| 2004/0070744 A1* | 4/2004 | Ozawa ..................... G02B 7/36 355/71 |
| 2004/0248043 A1* | 12/2004 | Shiraishi ................ G03F 7/701 430/311 |
| 2005/0206869 A1 | 9/2005 | Voorma et al. |

(Continued)

FOREIGN PATENT DOCUMENTS

| CN | 1869811 A | 11/2006 |
| JP | 2005-277414 | 10/2005 |

(Continued)

OTHER PUBLICATIONS

Korean Patent Office, Korean Office Action dated Mar. 8, 2016 for Application No. 10-2014-0192134, 13 pages.

*Primary Examiner* — Deoram Persaud
(74) *Attorney, Agent, or Firm* — Haynes and Boone, LLP

(57) ABSTRACT

A method and system for adjusting exposure intensity to reduce unwanted lithographic effects is disclosed. In some exemplary embodiments, the method of photolithography includes receiving a mask and a workpiece. An orientation of an illumination pattern relative to the mask is determined, and an intensity profile of the illumination pattern is adjusted according to the orientation. The mask is exposed to radiation according to the illumination pattern and the intensity profile. Radiation resulting from the exposing of the mask is utilized to expose the workpiece. In some such embodiments, the intensity profile includes an intensity that varies across an illuminated region of the illumination pattern.

20 Claims, 6 Drawing Sheets

(56) References Cited

U.S. PATENT DOCUMENTS

| | | | |
|---|---|---|---|
| 2007/0082272 A1 | 4/2007 | Mann et al. | |
| 2007/0252968 A1* | 11/2007 | Ohkubo | G03F 7/70141 355/67 |
| 2008/0175432 A1* | 7/2008 | Choi | G03F 1/144 382/100 |
| 2008/0309898 A1* | 12/2008 | Baselmans | G03F 7/70283 355/52 |
| 2009/0041934 A1* | 2/2009 | Tokimitsu | G02B 13/143 427/163.1 |
| 2009/0257043 A1* | 10/2009 | Mori | G03F 7/70191 355/71 |
| 2009/0268189 A1* | 10/2009 | Mann | B82Y 10/00 355/71 |
| 2009/0284727 A1* | 11/2009 | Muramatsu | G02B 3/06 355/71 |
| 2010/0119961 A1* | 5/2010 | Ye | G03F 1/144 430/30 |
| 2010/0208223 A1* | 8/2010 | Minoda | G03B 27/54 355/67 |
| 2010/0241396 A1* | 9/2010 | Rodenburg | A61B 6/483 702/167 |
| 2011/0116067 A1* | 5/2011 | Ye | G03F 7/70091 355/67 |
| 2011/0176139 A1* | 7/2011 | Yamaguchi | G01B 9/02044 356/456 |
| 2012/0013877 A1* | 1/2012 | Tanaka | G02B 26/008 355/67 |
| 2012/0069313 A1* | 3/2012 | Schmidts | G03F 7/70083 355/67 |
| 2012/0154777 A1* | 6/2012 | De Vries | G03F 7/70116 355/71 |
| 2013/0003033 A1* | 1/2013 | Lee | G03F 7/70475 355/67 |
| 2013/0077076 A1* | 3/2013 | Patra | G03F 7/70075 355/67 |
| 2013/0094077 A1* | 4/2013 | Brueck | G02B 21/06 359/385 |
| 2014/0315330 A1* | 10/2014 | Fujimori | G03F 7/70641 438/7 |
| 2015/0153652 A1* | 6/2015 | Zimmermann | G02B 26/0833 355/67 |
| 2016/0025554 A1* | 1/2016 | Gerhard | G01B 11/0616 355/67 |

FOREIGN PATENT DOCUMENTS

| | | |
|---|---|---|
| KR | 10-2009-0133137 | 12/2009 |
| TW | I289725 | 7/2001 |

* cited by examiner

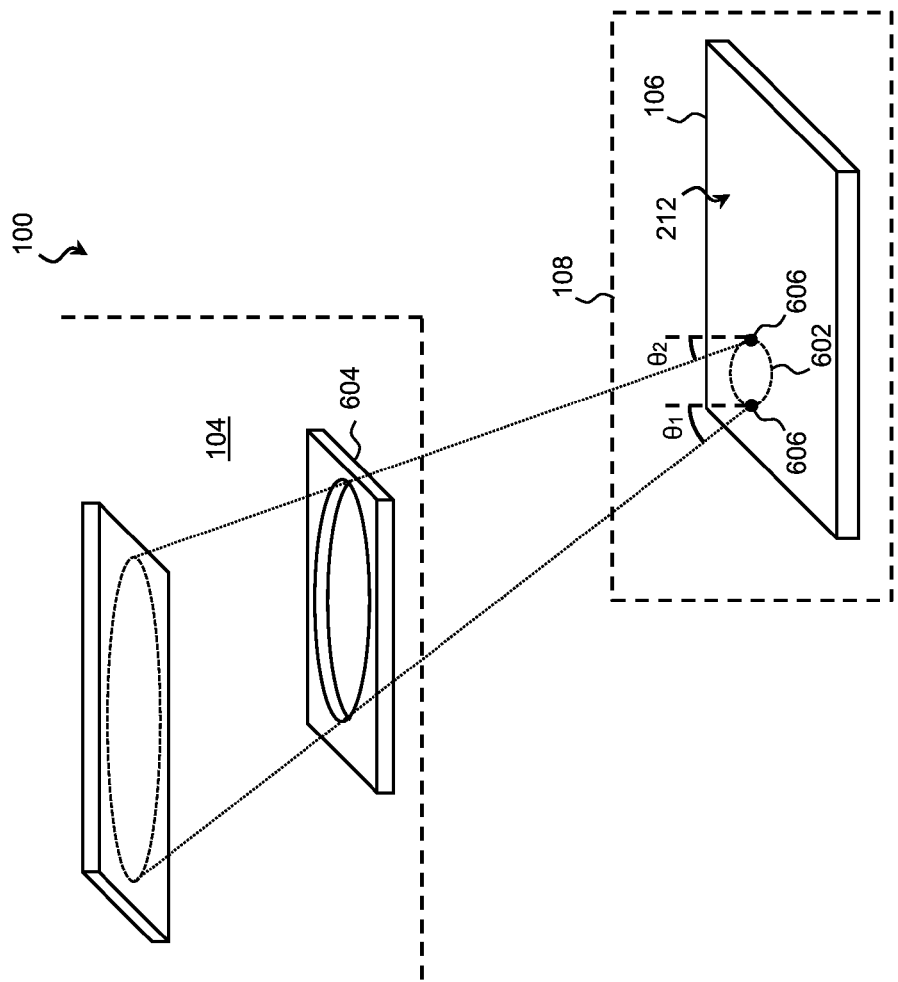
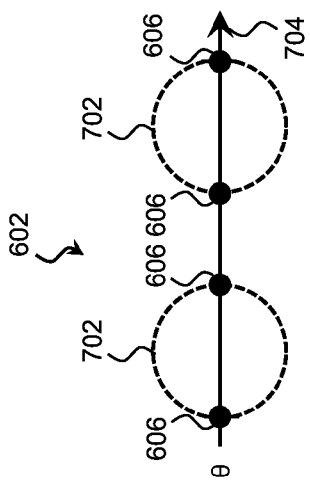
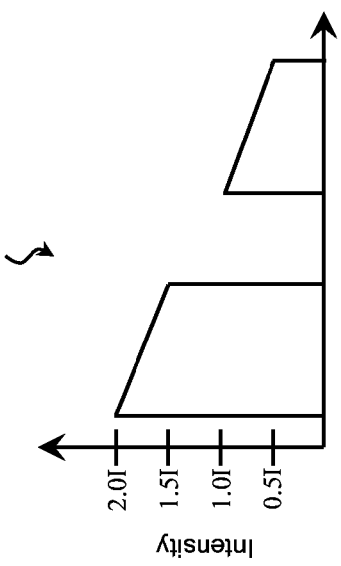

METHOD AND SYSTEM FOR REDUCING POLE IMBALANCE BY ADJUSTING EXPOSURE INTENSITY

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of fabrication and verification processes for ICs, and, for improvements to be fully realized, further developments in IC manufacturing are needed.

As merely one example, advances in lithography have been important to reducing device size. In general, lithography is the transfer of a pattern from a mask onto a workpiece such as a semiconductor substrate. In photolithography, the radiation used to transfer the pattern causes changes in affected areas of a photosensitive material formed on the workpiece. After exposure, the photosensitive material can be selectively removed to reveal the pattern. The workpiece then undergoes processing steps that take advantage of the shape of the remaining photoresist to create features on the workpiece.

In one type of lithography, extreme ultraviolet (EUV) radiation (i.e., radiation having a wavelength of about 1-100 nm) is used to transfer the pattern. However, because few materials are transmissive to EUV radiation, a complex system of reflective optics is used to direct and shape the EUV radiation. Accordingly, in many EUV systems, the mask containing the pattern to be transferred to the substrate is also reflective. EUV lithography poses a number of challenges, many of which arise from the arrangement of the reflective optics. For example, many reflective masks are not perfectly planar, and the thickness of the absorber formed on the mask may be much larger than the wavelength of the EUV radiation. Therefore, if the incident radiation is not completely perpendicular to the surface of the reflective mask, undesirable shadows and other 3D effects may occur. For these reasons and others, despite remarkable advances in EUV lithography, further improvements have the potential to deliver improved resolution, improved alignment, and improved yield. Therefore, while existing lithographic techniques have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 6 is a schematic diagram of a portion of a lithographic system according to aspects of the present disclosure.

FIG. 7 is a diagram of an exemplary illumination pattern according to aspects of the present disclosure.

FIG. 8 is a diagram of an exposure intensity profile of an exemplary illumination pattern according to aspects of the present disclosure.

DETAILED DESCRIPTION

Figure 1:
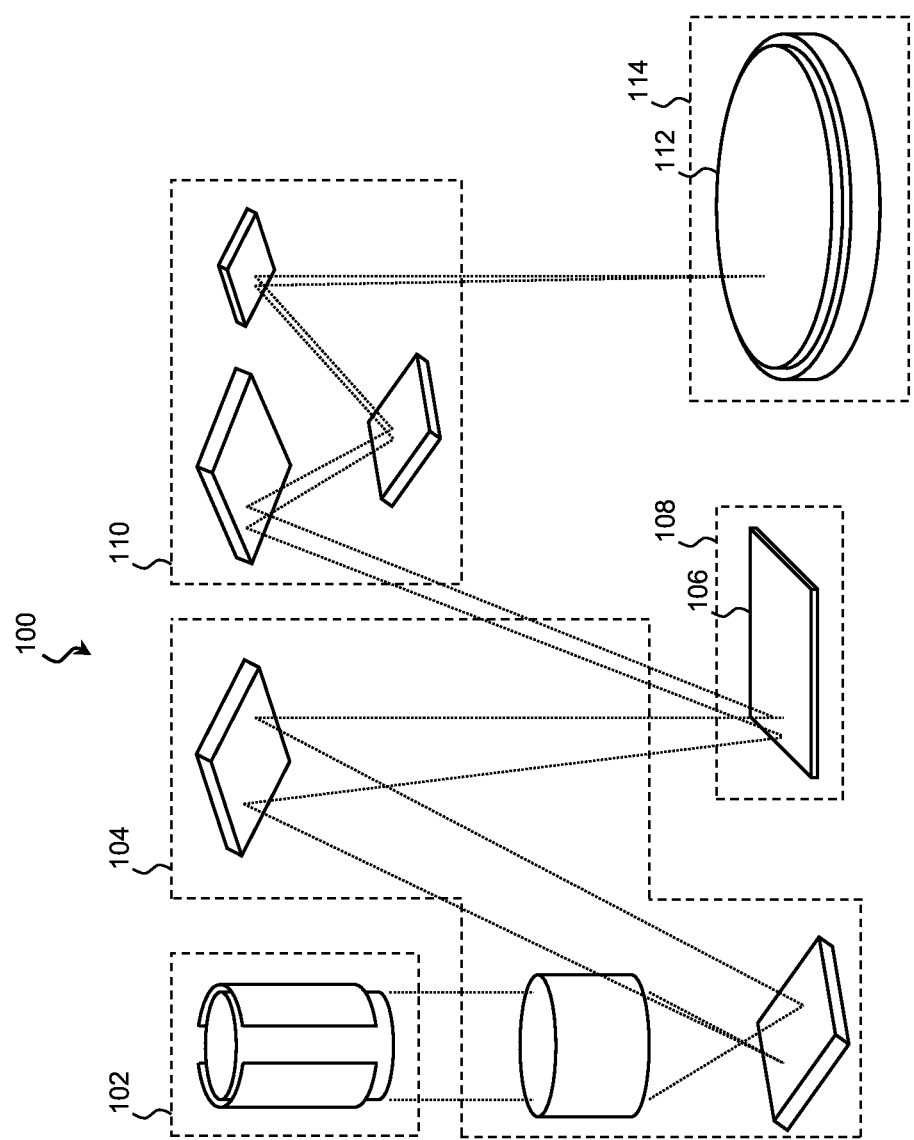
FIG. 1 is a block diagram of a lithography system according to various aspects of the present disclosure.

The present disclosure relates generally to IC device manufacturing and, more particularly, to a system and method for lithography that utilizes variable illumination intensity in order to reduce optical distortion including pole imbalance.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90° or at other orientations) and the spatially relative descriptors used herein may likewise be interpreted accordingly.

FIG. 1 is a block diagram of a lithography system 100 according to various aspects of the present disclosure. The lithography system 100, which may also be generically referred to as a scanner, is operable to perform a lithographic exposure process utilizing a characteristic radiation source and exposure mode. In the illustrated embodiments, the lithography system 100 is an extreme ultraviolet (EUV) lithography system designed to expose a workpiece using EUV radiation having a wavelength ranging between about 1 nm and about 100 nm. In some exemplary embodiments, the lithography system 100 includes a radiation source 102 that generates EUV radiation with a wavelength centered at about 13.5 nm. In one such embodiment, an EUV radiation source 102 utilizes laser-produced plasma (LPP) to generate the EUV radiation by heating a medium such as droplets of tin into a high-temperature plasma using a laser.

The lithography system 100 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or mirror arrays. The number of optical components shown FIG. 1 have been reduced for clarity, although in actual embodiments, the illuminator 104 includes dozens or even hundreds of lenses and/or mirrors. The optical components are arranged and aligned to project radiation emitted by the radiation source 102 onto a mask 106 retained in a mask stage 108. An exemplary mask 106 will be described in further detail in the context of FIG. 2. The optical components of the illuminator 104 may also shape the radiation along the light path in order to produce a particular illumination pattern upon the mask 106.

After passing through or reflecting off the mask 106, the radiation is directed through a projection optics module 110, also referred to as a projection optics box (POB). Similar to the illuminator 104, the projection optics module 110 may include refractive optical components, including monolithic lenses and/or array lenses (e.g., zone plates), and may include reflective optical components, including monolithic mirrors and/or mirrors arrays. The optical components of the projection optics module 110 are arranged and aligned to direct radiation transmitted through or reflecting off the mask 106 and to project it onto a workpiece 112, such as the illustrated semiconductor substrate or any other suitable workpiece, retained in a substrate stage 114. In addition to guiding the radiation, the optical components of the projection optics module 110 may also enlarge, narrow, focus, and/or otherwise shape the radiation along the light path.

Radiation projected by the projection optics module 110 on the workpiece 112 causes changes in a photosensitive component of the target. In a common example, the workpiece 112 includes a semiconductor substrate with a photosensitive resist layer. Portions of the photosensitive resist layer that are exposed to the radiation undergo a chemical transition making them either more or less sensitive to a developing process. In an exemplary embodiment, after exposure, the photosensitive resist layer undergoes a post-exposure baking, developing, rinsing, and drying in order to complete the transition. Subsequent processing steps performed on the semiconductor substrate may use the pattern to selectively process portions of the substrate.

Figure 2:
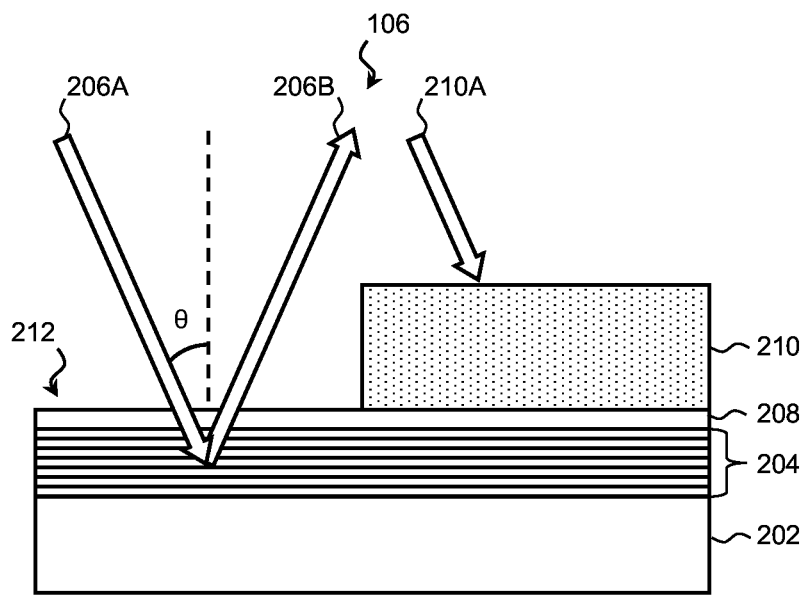
FIG. 2 is a cross-sectional illustration of a reflective photomask according to aspects of the present disclosure.

FIG. 2 is a cross-sectional illustration of a reflective photomask 106 according to aspects of the present disclosure. The mask may be substantially similar to mask 106 of FIG. 1 and is suitable for use with the illustrated lithography system 100. For the purposes of this disclosure, the terms mask, photomask, and reticle all refer to mask 106. In the illustrated embodiment, the mask 106 is a reflective mask because reflective masks are more commonly used with EUV lithography systems. The mask 106 includes various layers formed on a photomask substrate 202. The photomask substrate 202 commonly includes a low thermal expansion material (LTEM) such as quartz, LTEM glass, silicon, silicon carbide, silicon oxide, titanium oxide, Black Diamond® (a trademark of Applied Materials), and/or other low thermal expansion substances known in the art.

The layers may include a reflective structure 204 such as a multilayer mirror (MLM). An MLM comprises a number of alternating material layers tailored in thickness and/or material to achieve optimal constructive interference of the radiation reflected at each material interface while reducing light absorption. In an exemplary embodiment, an MLM includes 40 pairs of alternating molybdenum and silicon (Mo—Si) layers. In further exemplary embodiments, an MLM includes between 20 and 80 pairs of alternating molybdenum and beryllium (Mo—Be) layers. Radiation that reaches the reflective structure 204, such as the illustrated ray 206A, is reflected back for use in exposing the workpiece 112 as indicated by ray 206B. A capping layer 208 (also known as a buffer layer) may be disposed over the reflective structure 204. In an embodiment, the capping layer 208 protects the reflective structure 204 during an etching and/or repair process. The capping layer may include materials such as Ru, silicon dioxide, and/or amorphous carbon.

An absorptive layer 210 is disposed on the capping layer 208. As the name implies, the absorptive layer 210 absorbs radiation as indicated by ray 210A and prevents it from exposing the workpiece 112. The absorptive layer 210 and the reflective structure 204 work in conjunction to define a mask pattern. In that regard, the absorptive layer 210 is patterned so that the absorptive layer 210 only covers a portion of the reflective structure 204. Suitable materials for use in the absorptive layer 210 include TaN, TaBN, TiN, chromium, combinations thereof, and/or other suitable absorptive materials. In some embodiments, the absorptive layer 210 contains multiple layers of absorptive material, for example a layer of chromium and a layer of tantalum nitride. The absorptive layer 210 may also include an anti-reflective coating (ARC), and suitable ARC materials include TaBO, $Cr_2O_3$, $SiO_2$, SiN, $TaO_5$, TaON, and/or other suitable materials.

In the illustrated embodiment, radiation (indicated by rays 206A and 210A) is projected on the photomask 106. The radiation is oriented nearly perpendicular to the surface 212 of the mask 106. However, for a number of reasons, the angle of incidence $\theta$ may be non-zero and may even vary over the exposed portion of the mask 106. In various examples, $\theta$ ranges between about 1° and about 11°. Even the smallest deviations from perpendicular can produce a variety of optical effects that can impact patterning of the workpiece 112. Some of these effects are described in the context of FIG. 3.

Figure 3:
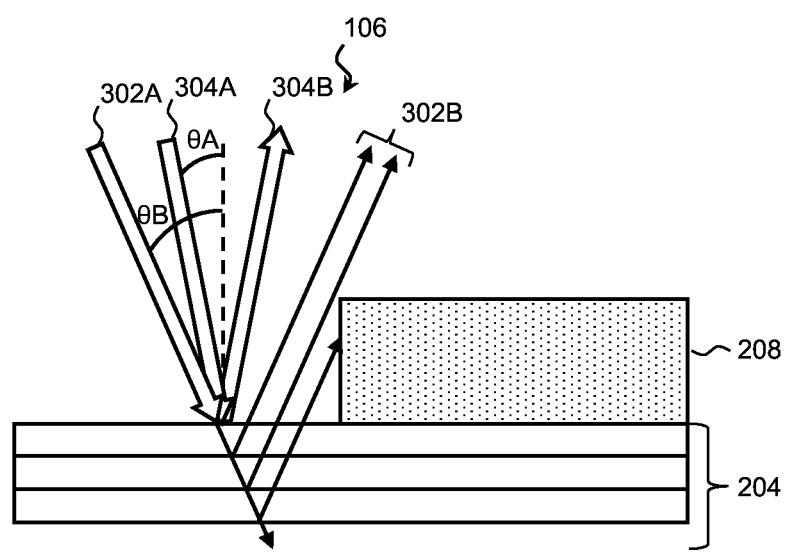
FIG. 3 is a cross-sectional illustration of a portion of a reflective photomask according to aspects of the present disclosure.

Referring now to FIG. 3, a cross-sectional illustration of a reflective photomask 106 is illustrated according to aspects of the present disclosure. In many regards, the photomask 106 is substantially similar to photomask of FIG. 2, although the photomask 106 of FIG. 3 has been simplified to more clearly illustrate the subject matter. In FIG. 3, two incident rays 302A and 304A of the radiation are shown. Rays 302A and 304A are used to conceptualize the effects of radiation directed towards the photomask 106. As can be seen, rays 302A and 304A are reflected by the reflective structure 204 to form reflected rays 302B and 304B respectively. Because ray 304A is unblocked by the absorptive layer 210, reflected ray 304B may have substantially the same intensity as the incident ray 304A (ignoring any loss due to the reflective structure 204). In contrast, some but not all of ray 302A is blocked by the absorptive layer 210. In particular, portions of ray 302B reflected by the upper portions of the reflective structure 204 are unblocked, while those reflected by deeper portions of the reflective structure 204 strike the absorptive layer 210. Thus, reflected ray 302B has reduced intensity when compared to reflected ray 304B. This may be referred to as a 3D effect in part because it arises from the three dimensional nature of the mask 106. As the angle of incidence θ of a ray becomes larger, the difference in intensity becomes more pronounced.

Figure 4:
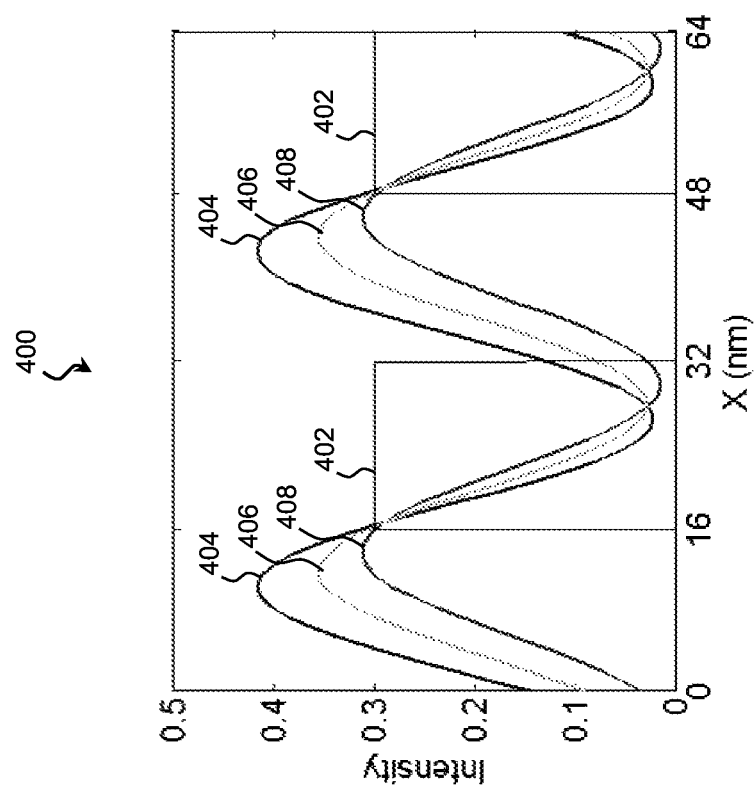
FIG. 4 is a plot of reflection intensity produced by a reflective mask according to aspects of the present disclosure.

In developing this disclosure, these effects have been analyzed and simulated. FIG. 4 is a plot 400 of reflection intensity produced by a reflective mask according to aspects of the present disclosure. The plot 400 graphs simulation results obtained from a reflective mask 106 used in an EVU lithography system 100. The X-axis represents locations on a mask 106 and corresponding locations on a workpiece 112. The Y-axis represents the intensity of the radiation at the corresponding location. The first plotted line 402 represents the areas of photomask 106 having an absorptive layer 210 formed on the photomask substrate 202. Such areas, indicated as having a non-zero value, would ideally produce zero radiation at corresponding locations on the workpiece 112. Thus, line 402 also represents the inverse of the ideal pattern to be formed on the workpiece 112. Plotted lines 404 and 408 represent the amount of radiation at the corresponding location on the workpiece 112 caused by radiation directed at different angles of incidence θ. For example, line 404 represents intensity produced by radiation having a smaller angle of incidence. Line 408 represents intensity produced by radiation having a larger angle of incidence. The middle line, plotted line 406, represents the averaged intensity of lines 404 and 408.

From the graph, it is clear that the peak intensities of lines 404 and 408 are different. These differences may be referred to as a pole imbalance. While pole imbalance has a measurable impact on functional devices, it may have the greatest impact on the positioning and shape of overlay features. Because overlay features are formed on a workpiece 112 and used to align subsequent lithographic processes, shifts in the overlay features can reduce overlay performance resulting in incomplete and disconnected interlayer connections. Accordingly, pole imbalance has been linked to defective devices and reduced yield.

Figure 5:
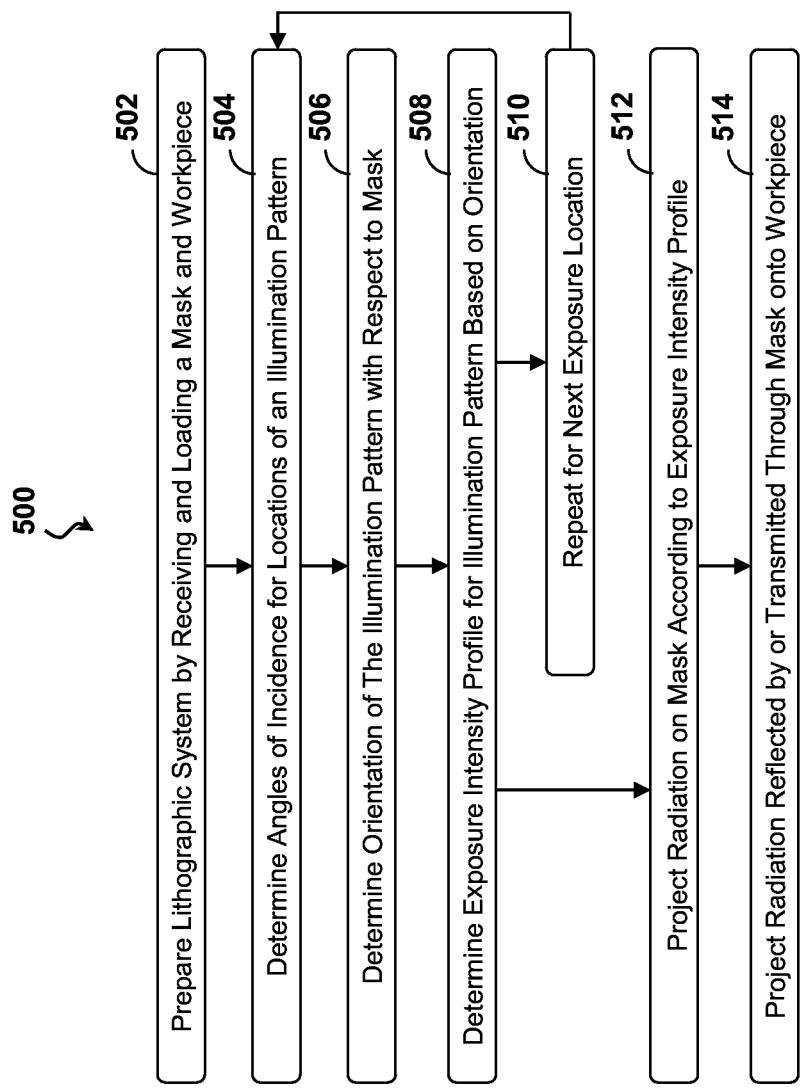
FIG. 5 is a flow diagram of a method of reducing pole imbalance according to aspects of the present disclosure.
Figure 9:
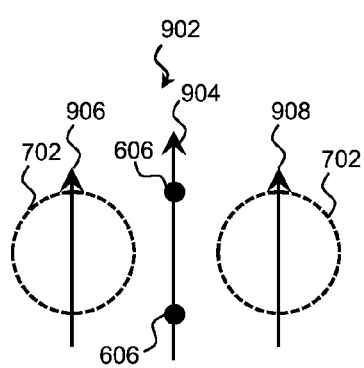
FIGS. 9 and 11 are diagrams of further illumination patterns according to aspects of the present disclosure.
Figure 10:
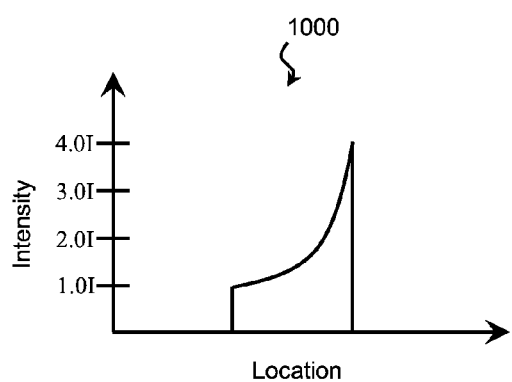
FIGS. 10, 12, and 13 are diagrams of further exposure intensity profiles corresponding to respective illumination patterns according to aspects of the present disclosure.
Figure 11:
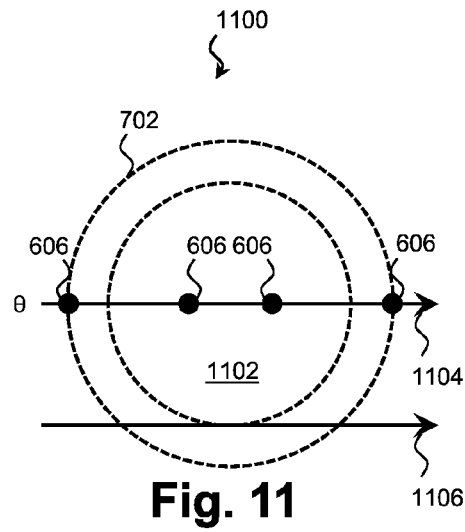
Figure 12:
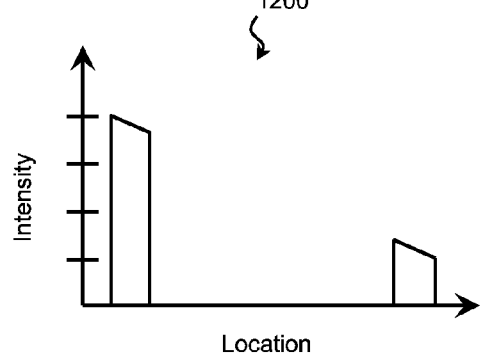
Figure 13:
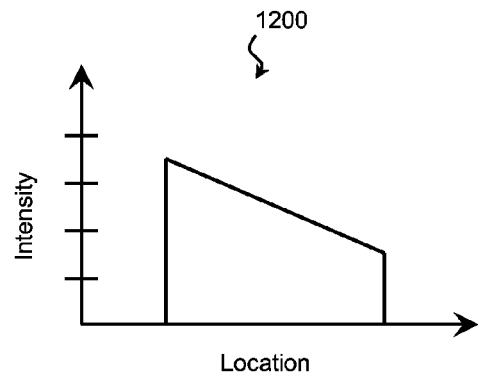

A method of reducing pole imbalance by modulating the illumination intensity is described with reference to FIGS. 5-13. FIG. 5 is a flow diagram of the method 500 of reducing pole imbalance according to aspects of the present disclosure. It is understood that additional steps can be provided before, during, and after the steps of method 500, and that some of the steps described can be replaced or eliminated for other embodiments of the method. FIG. 6 is a schematic diagram of a portion of a lithographic system 100 according to aspects of the present disclosure. FIG. 7 is a diagram of an exemplary illumination pattern according to aspects of the present disclosure. FIG. 8 is a diagram of an exposure intensity profile of the exemplary illumination pattern according to aspects of the present disclosure. FIGS. 9 and 11 are diagrams of further illumination patterns according to aspects of the present disclosure. FIGS. 10, 12, and 13 are diagrams of further exposure intensity profiles corresponding to respective illumination patterns according to aspects of the present disclosure.

Referring to block 502 of FIG. 5 and to FIG. 6, a lithographic system 100, which may be substantially similar to that of FIG. 1, is prepared for exposure. This may include receiving and loading a mask 106 in a mask stage 108 of the lithographic system 100 and receiving and loading a workpiece 112 in a substrate stage of the lithographic system 100. Referring to FIG. 6, the illuminator 104 of the lithographic system 100 is configured to expose a portion of the mask 106 with radiation shaped in an illumination pattern 602. In some embodiments, the illumination pattern 602 is produced by a pupil 604 of the illuminator 104 through which radiation is directed during exposure. In such embodiments, the pupil 604 may be a physical structure and may include a plate or other absorptive structure having one or more transmissive regions through which radiation may pass. In further embodiments, the optical components of the illuminator 104 shape the radiation in order to produce a radiation pattern that simulates a physical pupil 604. This may be referred to as a virtual pupil. Yet further embodiments utilize a combination of optical components and a physical pupil 604 to produce a particular illumination pattern 602. Exemplary illumination patterns 602 are discussed in greater detail in the context of FIGS. 7-13.

Referring to block 504 of FIG. 5, angles of incidence θ are determined for two or more selected reference locations 606 of the illumination pattern 602. The angles of incidence θ measure the orientation of the illumination pattern 602 with respect to the surface 212 of the photomask 106. As can be seen, the angle of incidence θ may vary throughout the illumination pattern 602 with some reference locations 606 of the illumination pattern 602 having a smaller angle of incidence θ than others. In many embodiments, the reference locations 606 are positioned at boundaries of the illumination pattern 602. For patterns 602 having multiple shapes (i.e., illuminated regions) the reference locations 606 may be positioned at boundaries of the respective shapes.

Referring to FIG. 7, a diagram of an exemplary illumination pattern 602 is illustrated according to aspects of the present disclosure. The illumination pattern 602 is typical of a dipole pattern and includes two shapes 702 (illuminated pattern regions) that are dipole shapes. In the illustrated embodiment, four reference locations 606 are selected at the boundaries of the shapes 702 as shown, and the respective angles of incidence are measured in block 504.

Referring to block 506 of FIG. 5 and referring still to FIG. 7, an overall orientation of the illumination pattern 602 is determined from the angles of incidence at the reference locations 606. The overall orientation represents the angle of incidence θ for each point of the illumination pattern 602 and indicates those regions of the illumination pattern 602 having the least angle of incidence, those regions having the greatest angle of incidence, and the relative orientation of those regions in between. In the illustrated embodiment, the angle of incidence θ varies over an axis 704 passing through the diameter of each illuminated pattern region 702. It is understood that in other embodiments, including those described below, the angle of incidence θ may vary over any suitable axis or axes.

Referring to block 508 of FIG. 5 and to FIG. 8, an exposure intensity profile 800 is determined for the illumination pattern 602 such that areas of the pattern 602 that have a higher angle of incidence θ have a correspondingly greater exposure intensity. In other words, large angles of incidence θ reduce reflection intensity due to optical effects such as the aforementioned 3D effects. Therefore, the exposure intensity produced by the illuminator 104 is increased in corresponding regions of the illumination pattern 602 in order to equalize the reflection intensity across the pattern 602.

FIG. 8 illustrates the relative intensity of the illumination pattern 602 as measured across axis 704. In the illustrated embodiment, the exposure intensity increases linearly as a function of the corresponding angle of incidence θ. Thus, in the embodiment, the illumination intensity within the illuminated pattern regions 702 ranges from 0.5*I to 2.0*I, where I is a baseline measurement of intensity for the illumination pattern 602. Outside of the illuminated pattern regions 702, the intensity drops to zero.

Both the numeric bounds of the illumination intensity and the linear relationship are merely exemplary. For example, in some embodiments, the exposure intensity at a point is related to a trigonometric function (e.g., sine, cosine, tangent, etc.) of the corresponding angle of incidence. In one such embodiment, the intensity at location X is substantially equal to $I_{min}+\lambda \sin(\theta_X)$, where $I_{min}$ is a minimum suitable intensity, $\theta_X$ is the angle of incidence corresponding to location X, and $\lambda$ is a constant related to a 3D effect of a particular mask 106. In yet further embodiments, the exposure intensity changes exponentially or by another nonlinear relationship over the illumination pattern 602.

Referring to FIGS. 9 and 10, a further exemplary illumination pattern 900 and exposure intensity profile 1000 are shown. Illumination pattern 900 is also a dipole pattern, and the exemplary angle of incidence θ varies over a single axis 904. However, in contrast to the previous examples, the axis 904 is oriented differently from axis 704 of FIG. 7. Axis 904 is perpendicular to a line drawn through the diameters of the dipole illuminated regions 702. Also in contrast to FIG. 7, in the embodiments of FIG. 9, the reference locations 606 are positioned outside of the illuminated regions 702 rather than on a boundary thereof.

Referring now to FIG. 10, the exemplary exposure intensity profile 1000, which varies across axis 904 according to the angle of incidence θ, is symmetrical for both illuminated pattern regions 702. Accordingly, FIG. 10 represents the exposure intensity along reference line 906 and reference line 908. The exemplary exposure intensity profile 1000 varies exponentially from a peak of 4.0*I to a low of 1.0*I, where I is a reference intensity for the illumination pattern 900.

Referring to FIGS. 11-13, a further exemplary illumination pattern 1100 and exposure intensity profile 1200 are shown. Illumination pattern 1100 is characteristic of an annular illumination pattern and has an annular illuminated pattern region 702. Center region 1102 corresponds to an unilluminated (dark) portion of the illumination pattern 1100. In the illustrated embodiment, the angle of incidence θ varies over an axis 1104 that crosses the diameter of the annular shape, and, as a result, the exemplary exposure intensity profile 1200 varies across this axis 1104. FIG. 12 is an illustration of the exposure intensity profile 1200 along the axis 1104. FIG. 13 illustrates the exposure intensity profile 1200 along reference line 1106. It is understood that these illumination patterns and exposure intensity profiles are merely exemplary and that other configurations are both contemplated and provided for.

Referring to block 510 of FIG. 5, the determinations of blocks 504 and 508 may be repeated for other exposures of the mask 106. In many embodiments, the illumination pattern 602 only exposes a portion of the mask 106 at a time, and thus the illumination pattern 602 is scanned across the mask 106 during the course of a lithographic process. Because the angles of incidence θ may change as the illumination pattern 602 is scanned, in some such embodiments, the exposure intensity profile 800 may be updated for one or more exposure positions by repeating the determination of blocks 504 and 508. Thus, the intensity values in the exposure intensity profile 800 may further vary based on the exposure position.

Referring to block 512 and referring back to FIG. 6, the illuminator 104 of the lithographic system 100 exposes the mask 106 by projecting radiation on the mask 106 according to both the illumination pattern 602 and the exposure intensity profile 800. Thus, the radiation projected on the mask 106 varies in intensity according to the angle of incidence θ. Referring to block 514, radiation reflected by or transmitted through the mask 106 is received by a projection optic module 110 of the lithographic system 100 and projected onto a workpiece 112. By adjusting the mask exposure intensity according to the angle of incidence θ, the radiation projected onto the workpiece 112 has more uniform intensity, and the pole imbalance is reduced.

The present embodiments can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can store the program for use by or in connection with the instruction execution system, apparatus, or device. The medium may include non-volatile memory including magnetic storage, solid-state storage, optical storage, cache memory, Random Access Memory (RAM).

Thus, the present disclosure provides a system and method for reducing pole imbalance. In some embodiments, method of photolithography is provided. The method includes receiving a mask and a workpiece; determining an orientation of an illumination pattern relative to the mask; adjusting an intensity profile of the illumination pattern according to the orientation; exposing the mask to radiation according to the illumination pattern and the intensity profile; and utilizing radiation resulting from the exposing of the mask to expose the workpiece. In one such embodiment, the intensity profile includes an intensity that varies across an illuminated region of the illumination pattern.

In further embodiments, a method is provided that includes: determining an angle of incidence for each of a plurality of reference locations of an illumination pattern to be projected on a photolithographic mask; determining an intensity for the illumination pattern based on the determined angles of incidence, wherein the determined intensity varies across the illumination pattern; projecting radiation on the photolithographic mask according to the illumination pattern and the determined intensity; and exposing a workpiece using radiation resulting from the radiation projected on the photolithographic mask. In an exemplary embodiment, the illumination pattern includes a plurality of shapes, and the intensity varies across at least one of the plurality of shapes.

In yet further embodiments, a system is provided that includes: a mask stage operable to retain a mask; a substrate stage operable to retain a workpiece; a radiation source; an illuminator operable to: shape the radiation produced by the radiation source into an illumination pattern; and expose the mask by providing the radiation shaped into the illumination pattern to the mask stage; and a projection optics module operable to direct the radiation from the mask to the workpiece in order to form a pattern on the workpiece, wherein the illuminator is further operable to expose the mask such that the provided radiation varies in intensity within the illumination pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of photolithography, the method comprising:
receiving a mask and a workpiece;
determining an orientation of an illumination pattern relative to the mask;
adjusting an intensity profile of the illumination pattern based on the orientation, wherein the intensity profile defines exposure intensities for various locations of the illumination pattern, wherein an exposure intensity is adjusted for a location based on a trigonometric function of an angle of incidence of radiation on the mask at the location when the orientation is determined;
exposing the mask to radiation according to the illumination pattern and the intensity profile; and
utilizing radiation resulting from the exposing of the mask to expose the workpiece.

2. The method of claim 1, wherein the intensity profile includes an intensity that varies across an illuminated region of the illumination pattern.

3. The method of claim 2, wherein the intensity of the intensity profile varies linearly across the illuminated region.

4. The method of claim 1, wherein the illumination pattern includes a plurality of illuminated regions, and wherein the intensity profile includes an intensity that varies across at least one of the plurality of illuminated regions.

5. The method of claim 4, wherein the plurality of illuminated regions includes a pair of dipole shapes and wherein the intensity varies along an axis that is coextensive with a diameter of each of the dipole shapes.

6. The method of claim 4, wherein the plurality of illuminated regions includes a pair of dipole shapes and wherein the intensity varies along an axis that is not parallel to a line that is coextensive with a diameter of each of the dipole shapes.

7. The method of claim 1, wherein the determining of the orientation of the illumination pattern includes selecting a plurality reference points of the illumination pattern and determining an angle of incidence for each of the plurality of reference points with respect to a surface of the mask, and
wherein the adjusted intensity profile is determined based on applying the trigonometric function to the angles of incidence of the plurality of reference points.

8. The method of claim 7, wherein each of the one or more reference points is selected to be on a boundary of an illuminated region of the illumination pattern.

9. The method of claim 1, wherein the determined orientation is a first orientation and corresponds to a first exposure position, the method further comprising:
determining a second orientation of the illumination pattern relative to the mask and corresponding to a second exposure position; and
adjusting the intensity profile according to the second orientation corresponding to the second exposure position.

10. The method of claim 1, wherein the trigonometric function is a sine function and the adjusted intensity profile is further determined based on the equation:

$$I_x = I_{min} + \lambda \sin(\theta_x)$$

where $I_x$ is the intensity at a location X, $I_{min}$ is a minimum intensity, $\theta_x$ is the angle of incidence corresponding to the location X, and $\lambda$ is a constant related to a 3D effect of the mask.

11. A method comprising:
determining an angle of incidence for each of a plurality of reference locations of an illumination pattern to be projected on a photolithographic mask;
determining an intensity for various locations of the illumination pattern based on the determined angles of incidence, wherein the intensity is increased as the angle of incidence increases relative to an axis perpendicular to the photolithographic mask, such that the determined intensity for the various locations varies across the illumination pattern;
projecting radiation on the photolithographic mask according to the illumination pattern and the determined intensity; and
exposing a workpiece using radiation resulting from the radiation projected on the photolithographic mask.

12. The method of claim 11, wherein the intensity varies non-linearly across the illumination pattern.

13. The method of claim 11, wherein the illumination pattern includes a plurality of shapes, and wherein the intensity varies across at least one of the plurality of shapes.

14. The method of claim 13, wherein each of the plurality of reference locations is positioned at a shape boundary of the plurality of shapes.

15. The method of claim 11, wherein the illumination pattern includes an annular shape.

16. A system comprising:
a mask stage operable to retain a mask;
a substrate stage operable to retain a workpiece;
a radiation source;
an illuminator operable to:
shape the radiation produced by the radiation source into an illumination pattern; and
expose the mask by providing the radiation shaped into the illumination pattern to the mask stage; and
a projection optics module operable to direct the radiation from the mask to the workpiece in order to form a pattern on the workpiece,
wherein the illuminator is further operable to expose the mask, such that the provided radiation varies in intensity within the illumination pattern, wherein an intensity of the radiation at a location of the illumination pattern is based on a trigonometric function of an angle of incidence of the radiation on the mask at the location during a previous exposure process.

17. The system of claim 16, wherein the illuminator is further operable to expose the mask such that the provided radiation varies in intensity within a shape of the illumination pattern.

18. The system of claim 16, wherein the illumination pattern includes a pair of dipole shapes, and wherein the illuminator is further operable to expose the mask such that the provided radiation varies in intensity along an axis that is coextensive with a diameter of each of the dipole shapes.

19. The system of claim 16, wherein the illuminator is further operable to expose the mask such that the provided radiation varies in intensity according to an exposure position.

20. The system of claim 16, wherein the trigonometric function is a sine function of the angle of incidence.

* * * * *